Oct. 6, 1970 A. P. KUBICZ 3,533,006

INFINITE RANGE ELECTRONICS GAIN CONTROL CIRCUIT

Filed Nov. 4, 1968

INVENTOR.
AUTHOR P. KUBICZ

BY Warren H. Kintinger
ATTORNEY 3,533,006

INFINITE RANGE ELECTRONICS GAIN CONTROL CIRCUIT

Arthur P. Kubicz, Richardson, Tex., assignor to Collins Radio Company, Cedar Rapids, Iowa, a corporation of Iowa Filed Nov. 4, 1968, Ser. No. 773,072
Int. Cl. H03g 3/30
U.S. Cl. 330—29 4 Claims

ABSTRACT OF THE DISCLOSURE

A bridge type gain control circuit with a signal input connection to one of four corners thereof, a ground connection at the opposite corner, with output utilizing circuitry connected between the two intervening corners, and with a field effect transistor, as one variable impedance leg of four bridge circuit legs, having a control electrode connection to a control voltage source.

Figure 1:
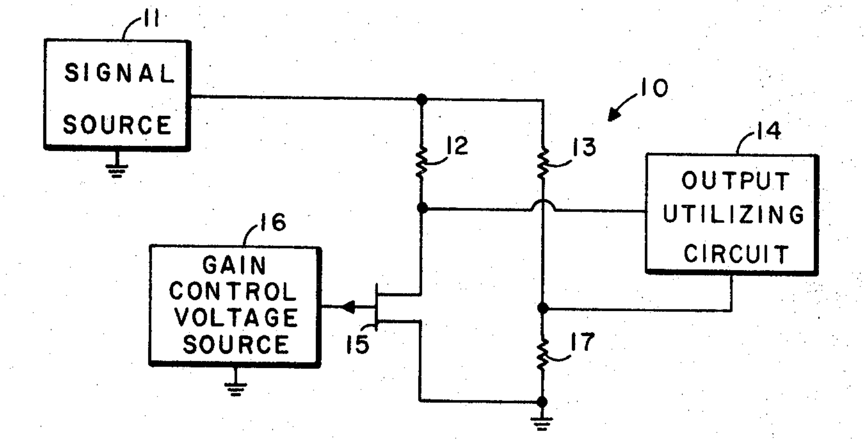

The invention described herein was made in the performance of work under a NASA contract and is subject to the provisions of Section 305 of the National Aeronautics and Space Act of 1958, Public Law 85–568 (72 Stat. 435; 42 U.S.C. 2457).

This invention relates in general to variable gain electronic circuits, and in particular, to an infinite range (within power capabilities of components used), from, substantially, a completely signal attenuated setting, electronics gain control circuit.

Many electrically controlled variable gain devices or circuits are somewhat limited in the range of attenuation adjustment available with other than a minimum attenuation level range easily attainable in a satisfactory manner, and with, in many applications, such ability being relatively unimportant. Maximum or full attenuation has, however, not been too readily obtainable for many applications where such capability is really needed with this limitation being due in large measure to the practical limitations imposed by component operational parameters of various control elements implementing variable gain control heretofore.

It is, therefore, a principal object of this invention to provide an electronics gain control circuit having virtually unlimited attenuation range adjustment capabilities, without any inherent frequency limitation, other than those that may exist for the adjustment control element used, and with response extending to DC.

Further objects are that there be no inherent linearity limitations, other, here again, than those that may exist for the adjustment control element used, with the maximum attenuation range independent of the resistance range of the control element in such a gain control circuit, and with complexity and expense advantageously minimized.

Features of this invention useful in accomplishing the above objects include, use of a bridge type gain control circuit with a field effect transistor being an adjustable impedance leg for one of four bridge legs and with resistors used in each of the other three legs. There is a signal input connection to one of the four corners of the bridge circuit, the opposite corner is connected to ground, and the two intermediate opposite corners are connected to an output signal utilizing circuit. In obtaining an infinite range of adjustment down to the signal fully attenuated state, the control electrode of the field effect transistor is connected to a gain control voltage source.

A specific embodiment representing what is presently regarded as the best mode of carrying out the invention is illustrated in the accompanying drawing.

Figure 2:
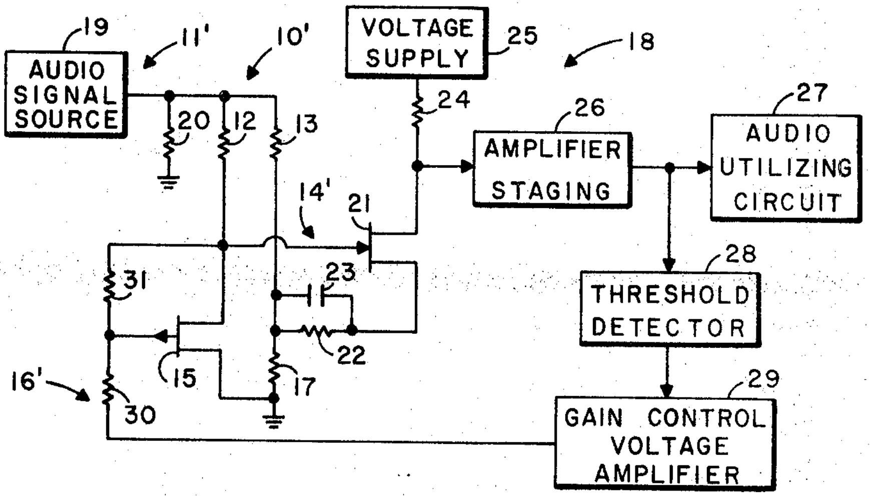

In the drawing:

FIG. 1 represents a block and schematic diagram of an infinite range (within power capabilities of components used) gain control circuit and, FIG. 2, a block and schematic diagram of a constant output audio amplifier using the infinite range gain control circuit of FIG. 1.

Referring to the drawing:

In the infinite range gain control circuit 10 of FIG. 1, a signal source 11 is connected for applying a signal input subject to gain control to the circuit 10 at the junction of resistors 12 and 13, the other ends of which are connected as output connections to output utilizing circuit 14. The output connected end of resistor 12 is also connected to a first electrode of an N channel field effect transistor 15 having a control electrode connection to the output of gain control variable voltage source 16 and a third electrode connected to ground. The output connected end of resistor 13 is also connected through resistor 17 to ground. This is, advantageously in effect, a very useful bridge circuit with an output voltage null, and full signal attenuation occurring when the bridge is so balanced, and with the full range of gain control readily provided through gain control voltage variation at the control electrode of the N channel field effect transistor 15 and corresponding variation thereby of impedance through that branch of the bridge circuit.

Application of the infinite range gain control circuit as used in the constant output audio amplifier 18, of FIG. 2, shows signal source 11′ to have an audio signal source 19 with the output connected through resistor 20 to ground and also to the junction of resistors 12 and 13. Components the same as in FIG. 1 are numbered the same; circuit sections similar carry primed numbers; and additional components and sections are given new additional numbers as a matter of convenience. The output utilizing circuit 14′, in the constant output audio amplifier 18 with the infinite range gain control circuit 10, includes a P channel field effect transistor 21 with the control electrode connected to the junction of resistor 12 and the N channel field effect transistor 15. A second electrode of the P channel field effect transistor 21 is connected through resistor 22 and capacitor 23, connected in parallel to the junction of resistors 13 and 17. A third output electrode of the P channel field effect transistor 21 is connected through resistor 24 to positive voltage supply 25 and also directly as an input to amplifier staging 26.

The output of amplifier staging 26 is connected as an input to audio utilizing circuit 27 and also in a feedback circuit loop, as part of gain control voltage source 16′, to threshold detector circuit 28. The output of threshold detector circuit 28 is connected to gain control voltage amplifier 29, in the loop, with the output therefrom connected through resistors 30 and 31 serially to the junction of resistor 12 and the two field effect transistors 15 and 21, and with the junction of resistors 30 and 31 connected to the control electrode of N channel field effect transistor 15.

In operation of the constant output audio amplifier 18, of FIG. 2, resistors 30 and 31 in the feedback circuit loop help improve linearity of the N channel field effect transistor 15. The P channel field effect transistor 21 and amplifier staging 26 are effective signal amplifiers with output peak voltage therefrom being sensed by the threshold detector 28 in developing ultimately via gain control voltage amplifier 29 appropriate control voltage at the control electrode of N channel field effect transistor 15. In obtaining optimum operational results, the voltage signal developed at the output terminals of the bridge circuit is applied through circuit components in the output signal utilizing circuitry providing relatively high input impedance thereto. A relatively well known fundamental property of bridge circuits, as such, is that an output voltage null occurs when the bridge is balanced and under this condition, although an input signal may be applied, no output signal appears with, in effect, infinite attenuation existing. This balanced null infinite attenuation state exists when $$\frac{R_{12}}{R_{13}}=\frac{R_{15}}{R_{17}}$$

with $R_{15}$ being the impedance at that time of transistor 15 in that leg of the bridge circuit. Please note that with the constant output audio amplifier, there exists, as a practical matter, upper limits to input signal power regardless of the ability to null and otherwise fully attenuate the signal at the output, and when input signal strength is too great, excessive distortion may be produced in the gain control element due to element operational parameter large signal nonlinearity.

Components and values used in an infinite range gain control circuit, as shown in FIG. 1, and in a constant output audio amplifier, as shown in FIG. 2, using the gain control circuit include the following:

Resistor 12—470K ohms.
Resistor 13—1K ohm.
N channel field effect transistor 15—2N2841.
Resistor 17—22 ohms.
Resistor 20—1.5K ohms.
P channel field effect transistor 21—2N4416.
Resistor 22—3.3K ohms.
Capacitor 23—2.2 μf.
Resistor 24—100K ohms.
Voltage supply 25—+20 volts DC.
Resistor 30—2.2 megohms.
Resistor 31—4.7 megohms.

Whereas this invention is here illustrated and described with respect to a single embodiment thereof, it should be realized that various changes may be made without departing from the essential contributions to the art made by the teachings hereof.

I claim:

1. A bridge type gain control circuit with four legs and four bridge junctions between adjacent leg ends connected to respective junctions: a signal input connection to a first bridge junction of the four bridge junctions; connection of a second bridge junction opposite the signal input first bridge junction to a voltage potential reference source; circuit means for connection of output utilizing circuitry between the third and fourth opposite intervening bridge junctions; resistive means in at least three of the four legs; a field effect transistor in the fourth leg with two electrodes connected, respectively, to adjacent bridge junctions; and with the control electrode of the transistor connected to a gain control variable voltage source in an amplifier with amplifier staging part of said output utilizing circuitry; and signal coupling and impedance matching circuitry interconnecting said two intervening third and fourth bridge junctions and said amplifier staging; wherein, said impedance matching circuitry is relatively high input impedance circuitry as seen by output signals from said two intervening third and fourth bridge junctions of the bridge circuit; wherein, said signal coupling and impedance matching circuitry includes a second transistor with the control electrode thereof connected to one of said two intervening third and fourth junctions of the bridge circuit; a second electrode of the second transistor is connected through a resistor and capacitor, connected in parallel, to the other of said two intervening third and fourth junctions of the bridge circuit; with the third electrode of the second transistor connected both through resistive means to a DC voltage supply and also in a signal output path to said amplifier staging; and said gain control variable voltage source includes a feedback loop from said amplifier staging to said transistor with a gain control voltage amplifier.

2. The bridge type gain control circuit of claim 1 wherein, said transistor is an N channel field effect transistor.

3. The bridge type gain control circuit of claim 2 wherein, said second transistor is a P channel field effect transistor; and said DC voltage supply is a positive DC voltage supply.

4. The bridge type gain control circuit of claim 1 wherein, an audio signal source is connected as said signal input connection; said amplifier staging has a signal output connection to audio utilizing circuitry; and a threshold detector is included in the feedback loop between said amplifier staging and said gain control voltage amplifier.

References Cited

UNITED STATES PATENTS

| | | | |
|---|---|---|---|
| 2,615,999 | 10/1952 | Culicetto | 330—146 X |
| 2,723,387 | 11/1955 | Slavin | 330—145 X |
| 3,383,615 | 5/1968 | Milberger et al. | 330—38 X |
| 3,435,375 | 3/1969 | Miller. | |

FOREIGN PATENTS

| | | |
|---|---|---|
| 835,307 | 5/1960 | Great Britain. |

ROY LAKE, Primary Examiner

J. B. MULLINS, Assistant Examiner

U.S. Cl.X.R.

330—145, 146